(12) United States Patent
Chuang

(10) Patent No.: US 11,658,184 B2
(45) Date of Patent: May 23, 2023

(54) FIN FIELD EFFECT TRANSISTOR WITH MERGED DRIFT REGION

(71) Applicant: TEXAS INSTRUMENTS INCORPORATED, Dallas, TX (US)

(72) Inventor: Ming-Yeh Chuang, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 29 days.

(21) Appl. No.: 17/109,244

(22) Filed: Dec. 2, 2020

(65) Prior Publication Data

US 2022/0173101 A1 Jun. 2, 2022

(51) Int. Cl.
| | |
|---|---|
| *H01L 27/092* | (2006.01) |
| *H01L 21/762* | (2006.01) |
| *H01L 21/8234* | (2006.01) |
| *H01L 29/40* | (2006.01) |
| *H01L 29/417* | (2006.01) |
| *H01L 29/78* | (2006.01) |

(52) U.S. Cl.
CPC ........ *H01L 27/0924* (2013.01); *H01L 21/762* (2013.01); *H01L 21/823431* (2013.01); *H01L 29/402* (2013.01); *H01L 29/41791* (2013.01); *H01L 29/7801* (2013.01); *H01L 29/7851* (2013.01)

(58) Field of Classification Search
CPC ........ H01L 29/66674–66681; H01L 29/7816; H01L 29/7835; H01L 29/7801; H01L 29/66795; H01L 29/785–7851; H01L 29/41791; H01L 29/0649–0653; H01L 21/823878; H01L 21/823481; H01L 21/762–76237; H01L 21/823431; H01L 21/823821; H01L 27/0886; H01L 27/1211; H01L 27/0924
See application file for complete search history.

(56) References Cited

U.S. PATENT DOCUMENTS

| | | | | |
|---|---|---|---|---|
| 5,304,827 A | * | 4/1994 | Malhi | H01L 29/7835 |
| | | | | 257/E29.256 |
| 6,211,552 B1 | * | 4/2001 | Efland | H01L 29/0847 |
| | | | | 257/338 |
| 7,560,808 B2 | * | 7/2009 | Korec | H01L 29/7816 |
| | | | | 257/E23.079 |

(Continued)

OTHER PUBLICATIONS

Bo-Yuan Chen et al. "RF power FinFET transistors with a wide drain-extended fin." 2017 Jpn. J. Appl. Phys. 56 04c409.

*Primary Examiner* — Errol V Fernandes
*Assistant Examiner* — Jeremy J Joy
(74) *Attorney, Agent, or Firm* — Andrew R. Ralston; Frank D. Cimino

(57) ABSTRACT

A fin field effect transistor (FinFET) includes a drain region, a merged drift region, and a plurality of fins. The drain region extends above a surface of a semiconductor substrate and has a first dopant concentration of first conductivity type. The merged drift region extends above the substrate surface and touches the drain region, and has a second lower dopant concentration of the first conductivity type. The plurality of fins extend above the substrate surface and each fin is directly connected to the merged drift region. Each fin is connected to a source region having the first conductivity type at a distal end of that fin from the merged drift region.

20 Claims, 7 Drawing Sheets

(56) References Cited

U.S. PATENT DOCUMENTS

| | | | | |
|---|---|---|---|---|
| 7,847,351 B2 * | 12/2010 | Denison | ................ | H01L 29/402 |
| | | | | 257/E21.409 |
| 7,888,192 B2 | 2/2011 | Marshall et al. | | |
| 9,768,293 B1 * | 9/2017 | Syue | ................ | H01L 29/66704 |
| 10,096,519 B2 | 10/2018 | Shieh et al. | | |
| 11,152,506 B1 * | 10/2021 | Chuang | ............ | H01L 29/66681 |
| 2009/0256199 A1 * | 10/2009 | Denison | ............. | H01L 29/7835 |
| | | | | 257/E21.409 |
| 2012/0049279 A1 * | 3/2012 | Shrivastava | ...... | H01L 29/78624 |
| | | | | 257/347 |
| 2012/0168817 A1 * | 7/2012 | Abou-Khalil | ......... | H01L 29/785 |
| | | | | 257/E27.06 |
| 2012/0193707 A1 * | 8/2012 | Huang | .............. | H01L 29/42356 |
| | | | | 257/E29.264 |
| 2013/0062692 A1 * | 3/2013 | Chen | ................... | H01L 29/0653 |
| | | | | 257/E29.256 |
| 2014/0151804 A1 * | 6/2014 | Meiser | ............. | H01L 29/66575 |
| | | | | 438/283 |
| 2014/0183629 A1 * | 7/2014 | Meiser | ............... | H01L 29/7816 |
| | | | | 438/286 |
| 2016/0133702 A1 * | 5/2016 | Yoo | .................... | H01L 29/1045 |
| | | | | 257/337 |
| 2016/0225896 A1 * | 8/2016 | Yoo | .................... | H01L 29/7848 |
| 2016/0372593 A1 * | 12/2016 | Yoo | .................... | H01L 29/7835 |
| 2017/0365602 A1 * | 12/2017 | Zhou | ................ | H01L 29/66681 |
| 2018/0175191 A1 * | 6/2018 | Pendharkar | ......... | H01L 29/7816 |
| 2018/0197987 A1 * | 7/2018 | Zhou | ................... | H01L 27/0886 |

* cited by examiner

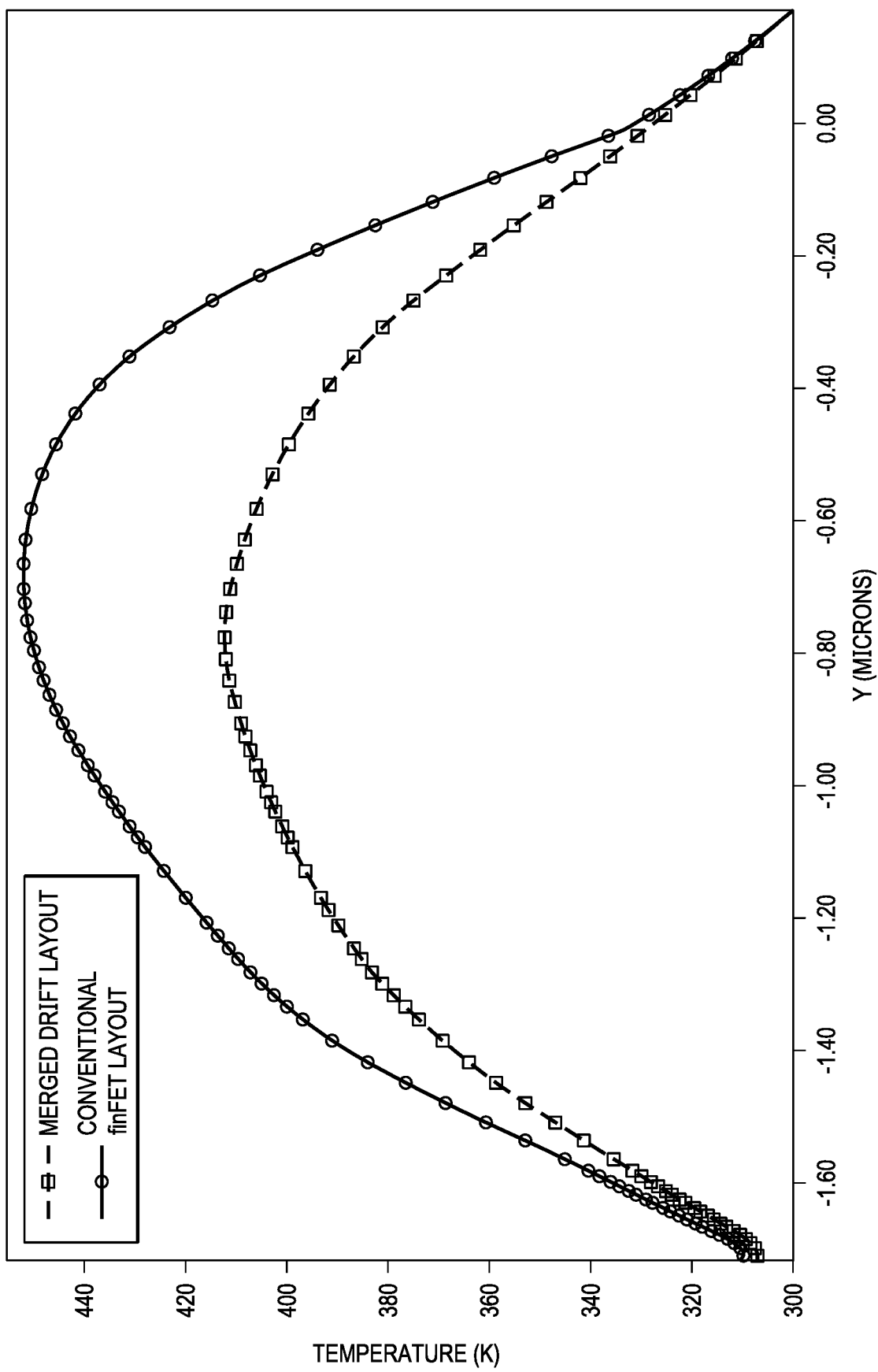

ated drift region in accor-

FIN FIELD EFFECT TRANSISTOR WITH MERGED DRIFT REGION

CROSS-REFERENCE TO RELATED APPLICATION

The present application is related to U.S. patent application Ser. No. 16/920,903, filed Jul. 6, 2020, entitled "Fin Field Effect Transistor with Field Plating," which is hereby incorporated herein by reference in its entirety.

BACKGROUND

Field effect transistors (FETs) can be formed in a variety of ways to serve a variety of purposes for integrated circuits and other devices. FETs are formed as "planar" devices in some integrated circuits, e.g., as devices in which the conduction channel has width and length extending in a direction below the major surface of a substrate. FETs can be formed in a silicon-on-insulator (SOI) layer of a substrate or in a bulk silicon substrate.

FETs having a non-planar conduction channel may also be fabricated. In such non-planar FETs, the length or the width of the transistor channel is oriented in the vertical direction, that is, in a direction perpendicular to the major surface of the substrate. In one such type of device, commonly referred to as the fin field effect transistor (FinFET), the width of the conduction channel is oriented in the vertical direction, while the length of the channel is oriented parallel to the major surface of the substrate. With such orientation of the channel, FinFETs can be constructed to have a larger width conduction channel than planar FETs so as to produce larger drive current than planar FETs which occupy the same amount of integrated circuit area (the area parallel to the major surface of the substrate).

SUMMARY

Fin field effect transistors (FinFETs) that include a merged drift region that extends across multiple fins are disclosed herein. The merged drift region improves heat dissipation of the FinFET. In one example, a FinFET includes a drain region, a merged drift region, a plurality of fins. The drain region extends above a surface of a semiconductor substrate and has a first dopant concentration of first conductivity type. The merged drift region extends above the substrate surface and touches the drain region, and has a second lower dopant concentration of the first conductivity type. The plurality of fins extend above the substrate surface and each fin is directly connected to the merged drift region. Each fin is connected to a source region having the first conductivity type at a distal end of the fin from the merged drift region.

In another example, a method for fabricating a FinFET includes etching a drain region having a first dopant concentration of first conductivity type from a semiconductor substrate. A merged drift region having a second lower dopant concentration of the first conductivity type is etched from the semiconductor substrate. A plurality of fins is etched from the semiconductor substrate. Each fin is directly connected to the merged drift region, and is connected to a source region having the first conductivity type at a distal end of the fin from the merged drift region.

In a further example, an integrated circuit includes a semiconductor substrate and a FinFET formed in or over the semiconductor substrate. The FinFET includes a merged drift region, a first fin, a second fin, a drain region, and a field plate oxide layer. The first and second fins are connected to a drain region that extends upward from the substrate. The merged drift region extends above the substrate and has a first conductivity type. The first and second fins extend upward from the substrate and from the merged drift region laterally over the substrate. The drain region extends upward from the substrate and extends from the merged drift region laterally over the substrate.

BRIEF DESCRIPTION OF THE DRAWINGS

For a detailed description of various examples, reference will now be made to the accompanying drawings in which:

FIG. 8 shows temperature in the drain-source channel of a conventional FinFET versus a FinFET with a merged drift region as described herein.

DETAILED DESCRIPTION

In some FinFETs, the fins may be narrow and isolated by oxide, such as shallow trench isolation structures. These factors may cause heat to be conducted primarily through the substrate or through the source and drain regions at the ends of the fins. Because the paths for heat conduction (the fins) are narrow, heat dissipation is inefficient. As a result, the operating temperature of FinFETs may be higher than that of equivalently rated planar power metal oxide semiconductor field effect transistors (MOSFETs).

In some conventional FinFETs the fins include a drift region that extends from a heavily doped drain contact region. In contrast, in the FinFETs disclosed herein, a portion of the drift region of the fins is widened to extend from fin to fin. In other words, the fins extend from a wide drift region, e.g. a region that is more lightly doped than the drain contact region. Merging of the drift regions of multiple fins may provide substantially improved dissipation of heat generated within the fins during operation of the FinFET. Consequently, the operating temperature of the FinFETs disclosed herein is expected to be significantly lower than that of such conventional FinFETs. Implementations of the FinFETs may also include a field plate oxide over the drift region that may improve the drain breakdown voltage and reduce leakage current.

Figure 1:
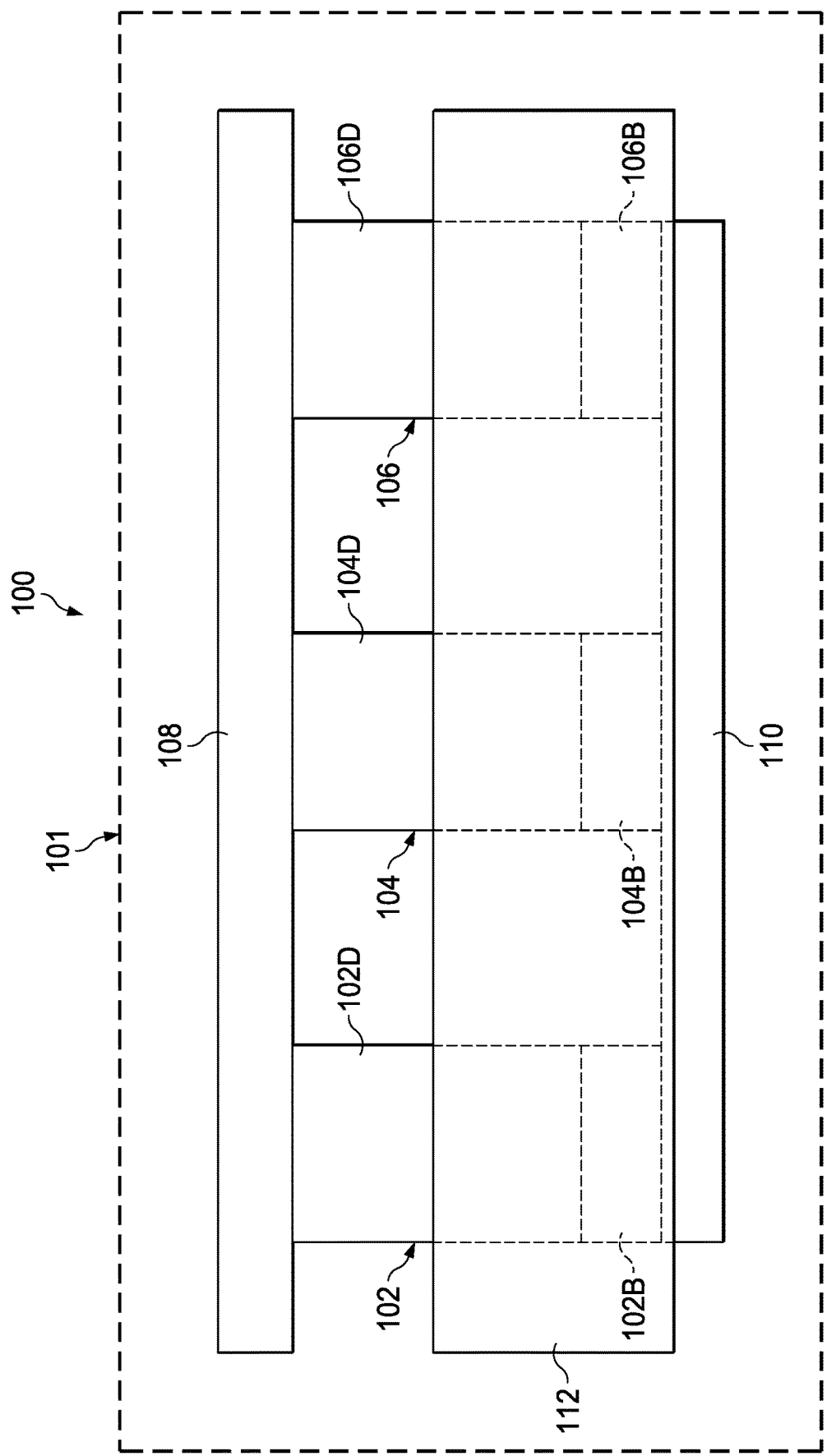
FIG. 1 shows a top view of an example fin field effect transistor (FinFET)

FIG. 1 shows a top view of an example fin field effect transistor (FinFET) 100 that includes some conventional characteristics. The FinFET 100 includes a substrate 101. The substrate 101 has a major surface that is parallel to a plane that intersects a plurality of fins (fin 102, fin 104, and fin 106), a drain region 108, and a source region 110 extending from the substrate 101. While fin 102, fin 104, and fin 106 are shown in FIG. 1, the FinFET 100 may include two or more fins. The fin 102 includes a drift region 102D and body region 102B. The fin 104 includes a drift region 104D and body region 104B. The fin 106 includes a drift region 106D and body region 106B. The drift regions 102D, 104D, and 106D of the fins 102, 104, and 106 are adjacent the drain region 108. The body regions 102B, 104B, and 106B of the fins 102, 104, and 106 are adjacent the source region 110.

The FinFET 100 includes a gate electrode 112 that is formed about three sides of the body region and three sides of at least a portion of the drift region of each of the fins 102, 104, and 106 to control current flow in the FinFET 100.

Current flow in the fins 102, 104, and 106 produces heat. The fins 102, 104, and 106 conduct the heat to the drain region 108 or the source region 110 to be dissipated, and/or conduct the heat through the substrate 101 to be dissipated. Heat conduction through the narrow fins 102, 104, and 106 is relatively inefficient which increases the operating temperature of the FinFET 100.

Figure 2:
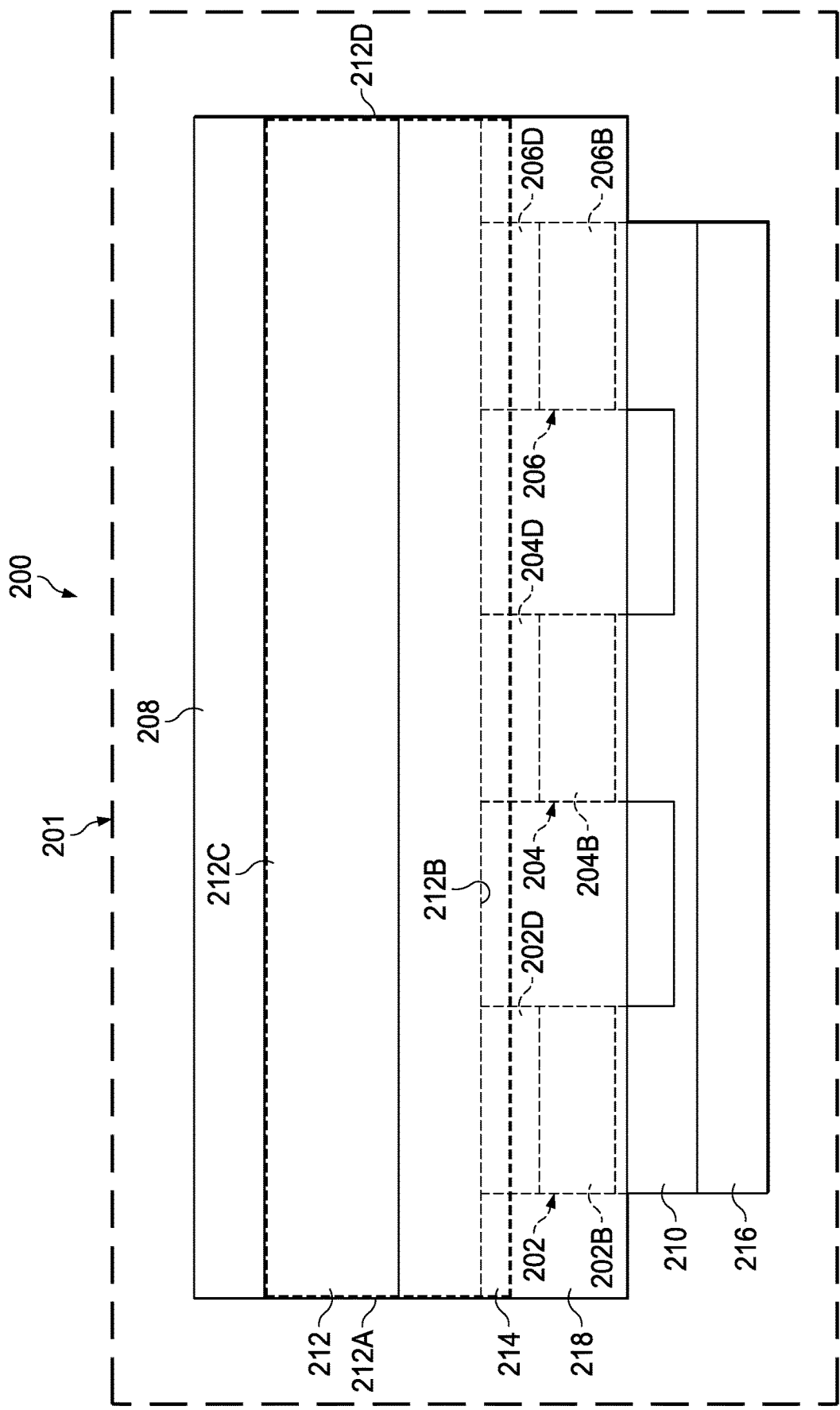
FIG. 2 shows a top view of an example FinFET with a merged drift region as described herein.

FIG. 2 shows a top view of an example FinFET 200 with a merged drift region as described herein. The FinFET 200 includes a substrate 201. A plurality of fins (e.g., fin 202, fin 204, and fin 206), a drain region 208, a source region 210, and a merged drift region 212 extend from the substrate 201. This figure illustrates the FinFET 200 in one example, in which the source region 210 directly electrically connects to each of the fins 202, 204 and 206. While fin 202, fin 204, and fin 206 are shown in FIG. 2, the FinFET 200 may include two or more fins. The fin 202 includes a fin drift region 202D and body region 202B. The fin 204 includes a fin drift region 204D and body region 204B. The fin 206 includes a fin drift region 206D and body region 206B. The fin drift regions 202D, 204D, and 206D of the fins 202, 204, and 206 extend from and are electrically connected to a merged drift region 212. The merged drift region 212 is adjacent to and contacts, e.g. touches, the drain region 208. The source region 210 is disposed at an end of the fins 202, 204, 206 opposite the drain region 208. The body regions 202B, 204B, and 206B of the fins 202, 204, and 206 each electrically connected to the source region 210. An optional back gate 216 extends from the source region 210. The fin drift regions 202D, 204D, and 206D are each electrically connected to the merged drift region 212.

A relatively thick (e.g., 30 nanometers (nm) to 120 nm) oxide layer is formed on the merged drift region 212, the fin drift region 202D, the fin drift region 204D, and the fin drift region 206D to provide a field plate oxide layer 214. The field plate oxide layer 214 may increase the drain breakdown voltage of the FinFET 200. The field plate oxide layer 214 may be formed on sides 212B and 212C of the merged drift region 212. Optionally but preferably the field plate oxide layer 214 extends over at least a portion of each of the fin drift regions 202D, 204D and 206D. A gate dielectric layer 215 (see FIG. 3) is located over at least a portion of each of the body regions 202B, 204B, and 206B, and a portion of the source region 210.

The FinFET 200 includes a gate electrode 218 that is formed about three sides of the body regions 202B, 204B, and 206B and the fin drift regions 202D, 204D and 206D, and a portion of the source region 210 proximate the body regions over the field plate oxide layer 214 and gate dielectric layer 215. The control current flow in the FinFET 200 may be controlled by applying a suitable potential on the gate electrode 218. The gate electrode 218 may also be formed about at least a portion of the merged drift region 212 (over the field plate oxide layer 214) in some implementations of the FinFET 200.

As in the FinFET 100, current flow in the fins 202, 204, and 206 produces heat. However, the merged drift region 212 dissipates heat more efficiently than the fins alone which reduces the operating temperature of the FinFET 200 relative to that of the FinFET 100.

Figure 3:
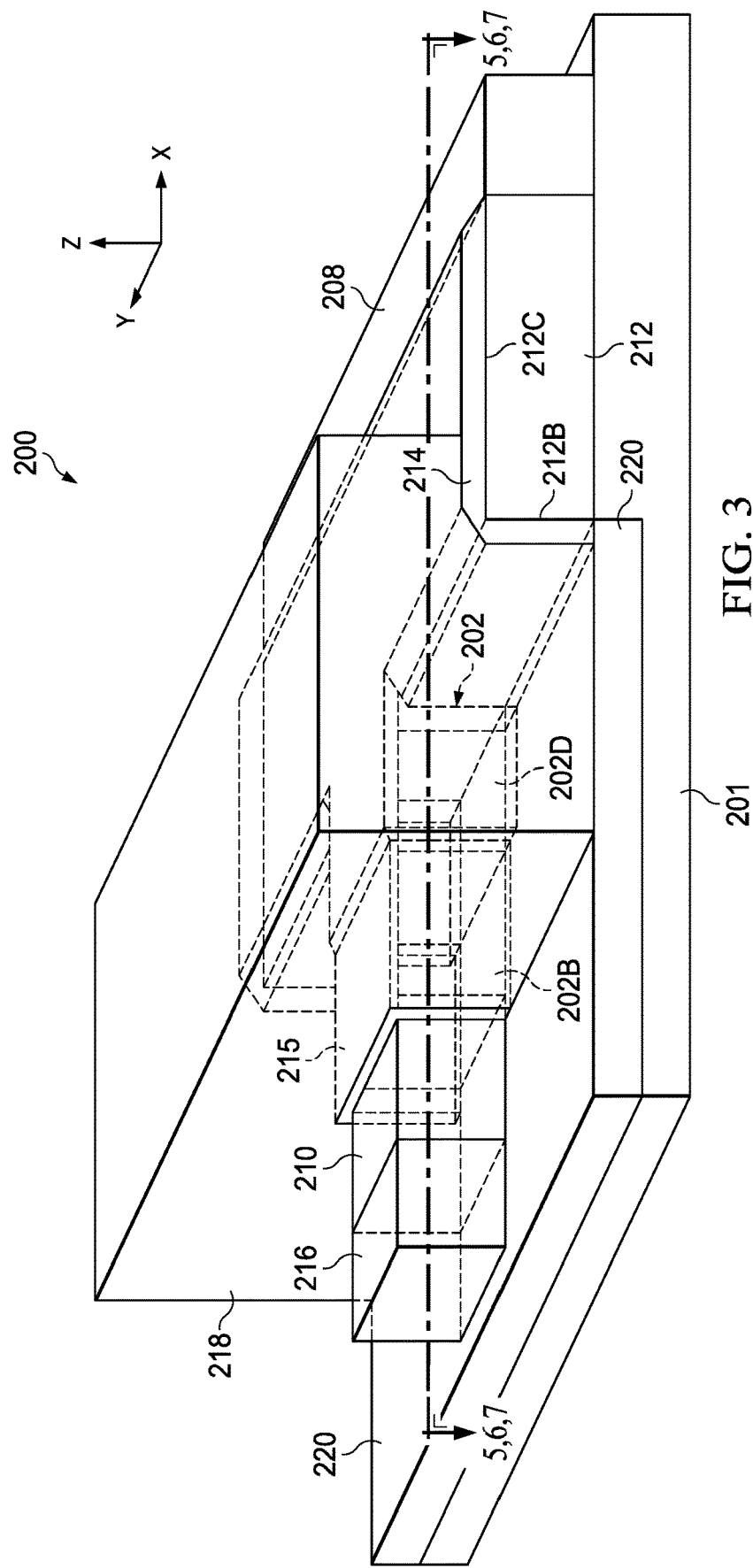
FIG. 3 shows a perspective view of an example FinFET with a merged drift region as described herein.

FIG. 3 shows a perspective view of a portion of the FinFET 200 with a merged drift region 212 as described herein. Only the fin 202 is shown in FIG. 3 for clarity. This figure illustrates the FinFET 200 in another example, in which each fin is connected to a distinct source region 210 that corresponds to that fin. In other words, the source region 210 of each fin is not connected via a doped semiconductor region to source regions of other fins. The fin 202, the drain region 208, the merged drift region 212, the source region 210 and the optional back gate 216 extend from the substrate 201. The fin 202 (and the fins 204 and 206, not shown in FIG. 3) extend between, and may be perpendicular to, the merged drift region 212 and the source region 210. The field plate oxide layer 214 is formed on the side 212B and the side 212C of the merged drift region 212, and extends over the top and sides of the fin 202 over the fin drift region 202D. The field plate oxide layer 214 thins over the fin drift region 202D to meet the gate dielectric layer 215 near the junction between the fin drift region 202D and the body region 202B. The top and sides of the body region 202B are covered by the gate dielectric layer 215. A metal silicide layer, not shown may be formed on the drain region 208, the source region 210 and the back gate 216 to provide an ohmic connection to these terminals of the FinFET 200.

For an NMOS device, the drain region 208 and the source region 210 may be doped, for example, with an n-type dopant in a range of $5e20/cm^2$ to $1e21/cm^2$. The merged drift region 212 and the fin drift region 202D may be doped, for example, with an n-type dopant in a range of $1e16/cm^2$ to $1e17/cm^2$. In various examples the merged drift region 212 and the fin drift region 202D have a same dopant concentration. The body region 202B and the optional back gate 216 may be doped, for example, with a p-type dopant in a range of $1e18/cm^2$ to $5e18/cm^2$. For a PMOS device the dopant types may be reversed in each doped region, and may be doped with similar concentrations as described for the NMOS example. Shallow trench isolation (STI) 220, which may be also considered a field oxide layer, isolates the gate electrode 218 from the substrate 201.

Figure 4:
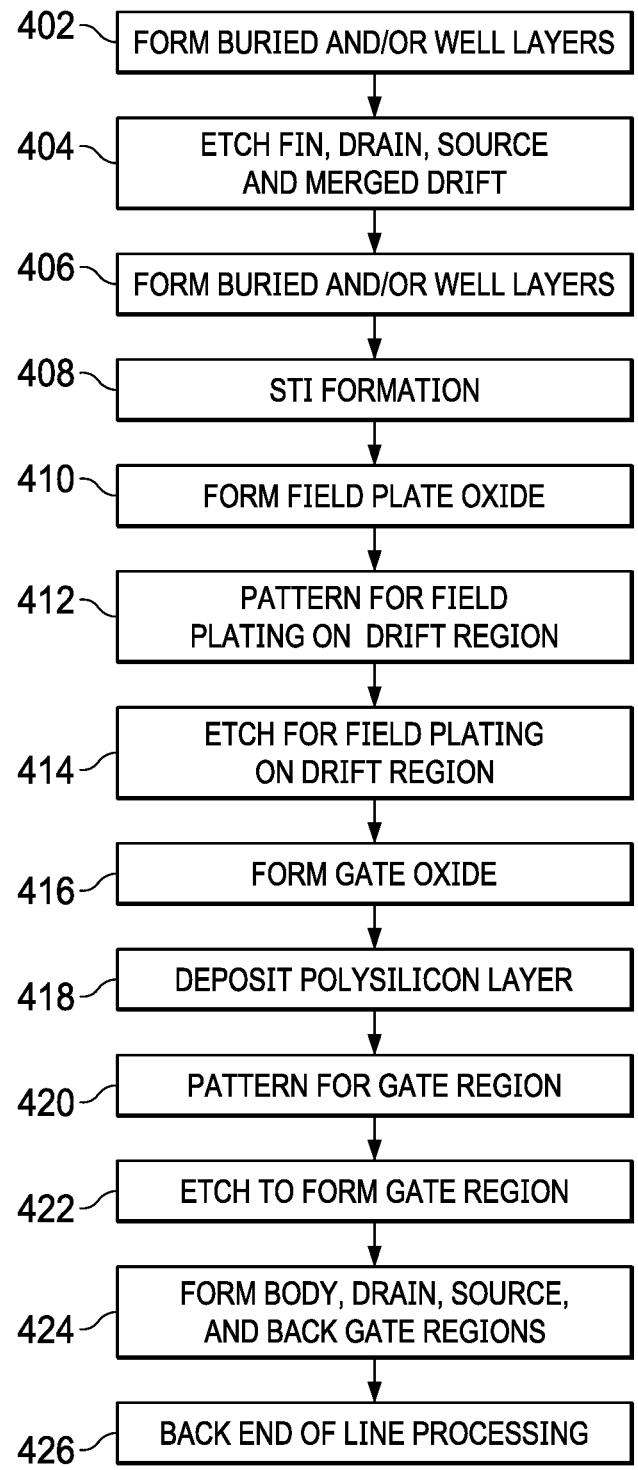
FIG. 4 shows flow diagram for an example method for fabricating a FinFET with a merged drift region in accordance with this description.

FIG. 4 shows flow diagram for an example method 400 for fabricating a FinFET with a merged drift region in accordance with this description, e.g. the FinFET 200. The method 400 is described without implied limitation with reference to features of the FinFET200. Though depicted sequentially as a matter of convenience, at least some of the actions shown can be performed in a different order and/or performed in parallel. Additionally, some implementations may perform only some of the actions shown.

In block 402, buried and/or well layers are formed in the substrate 201. The substrate 201 may be bulk silicon, silicon on insulator (SOI), etc. In one example, a reduced surface field (RESURF) layer is formed on the oxide layer of an SOI substrate. In another example, an n-type layer is formed in a bulk silicon substrate and a RESURF layer is formed on the n-type layer.

In block 404, the fin 202, the fin 204, the fin 206, and the merged drift region 212 are formed on the substrate. The fin 202, the fin 204, the fin 206, and the merged drift region 212 may be formed by etching an epitaxial silicon layer formed over the substrate 201. At least one fin is formed, and optionally two or more fins may be formed. An example fin may have a width of about 0.15 micrometers and a height of about 0.4 micrometers.

In block 406, additional buried and/or well structures are formed. For example, impurities may be added to the silicon to adjust the threshold voltage or other parameters of the FinFET. In some implementations of the method 400, an n-type dopant is implanted in the merged drift region 212, the fin drift region 202D, the fin drift region 204D, and the fin drift region 206D to improve drain breakdown voltage in the FinFET 200, and/or a RESURF layer may be formed by implantation at the base of each fin. In some examples, the drain region 208 and the source region 210 may be heavily doped, and the merged drift region 212 and fin drift regions 202D, 204D and 206D may be doped with a lower dopant concentration.

In block 408, the STI 220 is formed on the substrate 201. The STI 220 isolates the gate electrode 218, formed at block 422, from the substrate 201. In one example formation of the STI 220 includes depositing a dielectric material, such as silicon dioxide, on the substrate 201 to fill the space about the fins, and etching the dielectric material to a desired thickness, thereby exposing a desired height of the fins 202, 204, and 206, the merged drift region 212, etc. that extend from the substrate 201 above the surface of the STI 220. Optionally chemical-mechanical polishing (CMP) may be used to remove the dielectric material from the fins before etching the dielectric material.

In block 410, the field plate oxide layer 214 is formed. In one example, a thick dielectric layer is formed on the surface of the FinFET 200. The thick dielectric layer may be silicon dioxide and have a thickness in a range from about 30 nm to about 120 nm in some implementations. The thick oxide layer may be formed by thermal oxidation and/or oxide deposition. In some implementations of the FinFET 200, a layer of plasma-deposited oxide using tetraethoxysilane (TEOS) feedstock may be deposited over the thick dielectric layer.

In block 412, a layer of photoresist material is applied over the thick dielectric layer formed in block 410. The photoresist material is patterned to produce a desired pattern of the field plate oxide layer 214 on the merged drift region 212, the fin drift region 202D, the fin drift region 204D, and the fin drift region 206D.

In block 414, the thick dielectric layer formed in block 410 is etched where exposed by the photoresist material to create the field plate oxide layer 214 on the merged drift region 212, the fin drift region 202D, the fin drift region 204D, and the fin drift region 206D. For example, the thick dielectric layer is removed from all surfaces of the FinFET 200 except surfaces of the merged drift region 212, the fin drift region 202D, the fin drift region 204D, and the fin drift region 206D. In some examples wet etching may be applied to remove the exposed thick dielectric layer, while in other examples a plasma etch may be used.

Figure 5:
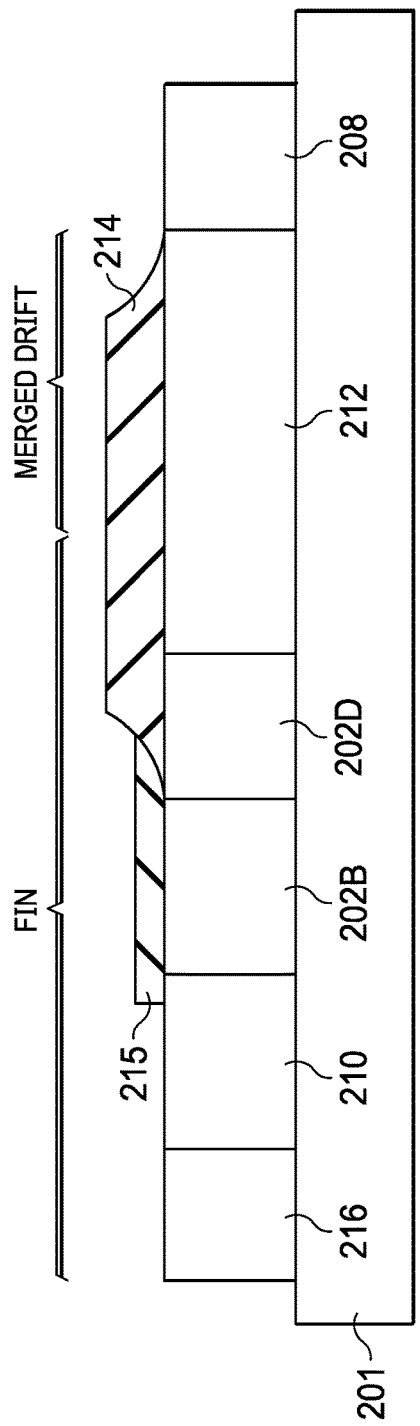
FIG. 5 shows a cross-sectional view of an example fin of a FinFET with gate dielectric and field plate oxide as described herein.

In block 416, a thin layer of dielectric material is formed on exposed silicon surfaces of the FinFET 200. This layer of dielectric material may be silicon dioxide, and forms a gate dielectric layer (also referred to as a gate oxide layer) for the FinFET 200. The layer of dielectric material may be formed by thermal oxidation of exposed silicon surfaces, followed by pattern and etch to remove the layer from areas where the layer is unwanted, e.g. over the drain region 208, the source region 210 and back gate 216 if present. The thick dielectric layer formed in block 410 is thicker than the thin dielectric layer formed in block 416. For example, the thin oxide layer may be about 12 nm thick when the FinFET 200 is designed to operate at 5 volt, and about 8 nm thick when the FinFET 200 is designed to operate at 3 volt. FIG. 5 shows a cross-sectional view of the gate dielectric layer 215 formed on the fin drift region 202D, the body region 202B, and a portion of the source region 102, and shows the field plate oxide layer 214 formed on the fin drift region 202D and the merged drift region 212. Optionally the field plate oxide layer 214 has a smooth corner at the transition to the gate dielectric layer 215, and may further have a smooth corner along additional portions or an entirety of its perimeter. As seen in FIG. 5, the smooth corner includes a concave sidewall surface. It is believed that the smooth corner may increase the breakdown voltage of the FinFET 200. A method of forming the smooth corner may be found in U.S. patent application Ser. No. 16/920,903.

In block 418, a polysilicon layer is deposited over the field plate oxide layer 214 and the gate dielectric layer 215. The polysilicon layer will be patterned and etched to form the gate electrode 218 of the FinFET 200.

Figure 6:
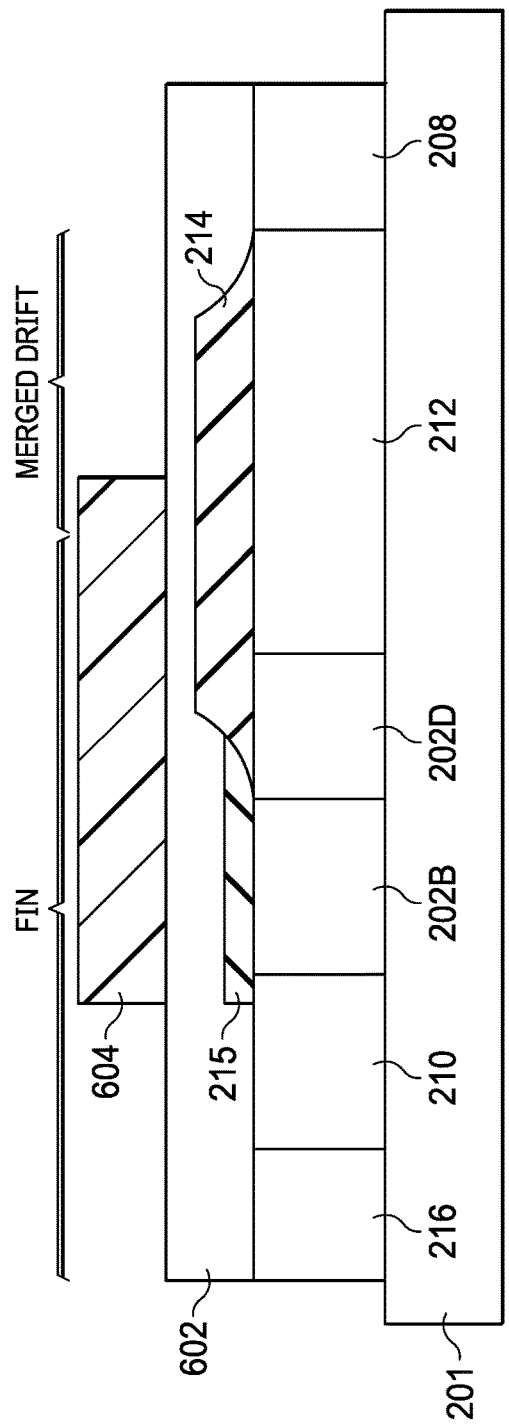
FIG. 6 shows a cross-sectional view of an example fin of a FinFET with a polysilicon layer and photoresist applied for fabricating a gate region of the FinFET as described herein.

In block 420, a layer of photoresist is applied to the polysilicon. The photoresist is exposed to light using a mask with the desired pattern of the gate electrode 218, e.g. over the body region 202B, the body region 204B, the body region 206B, the fin drift region 202D, the fin drift region 204D, the fin drift region 206D, and a portion of the merged drift region 212. FIG. 6 shows a cross-sectional view of the polysilicon layer 602 and the photoresist material 604 applied to the fin 202 and the merged drift region 212.

Figure 7:
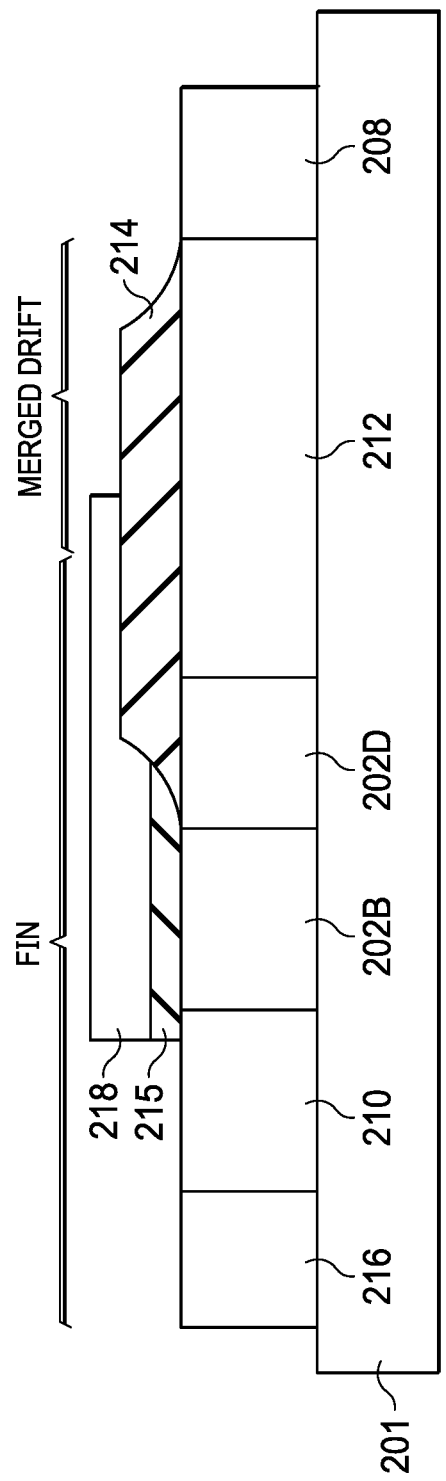
FIG. 7 shows a cross-sectional view of an example fin of a FinFET with a gate region formed over a gate dielectric and a portion of field plate oxide as described herein.

In block 422, the polysilicon layer is etched to form the gate electrode 218 of the FinFET 200. FIG. 7 shows a cross-sectional view of the gate electrode 218 formed over a portion of the gate dielectric layer 215 adjacent the body region 202B, a portion of the source region 210, and a portion of the field plate oxide layer 214 adjacent the fin drift region 202D and the merged drift region 212.

In block 424, the source region 210 is formed adjacent the find 202, 204 and 206, the body regions 202B, 204B and 206B are formed adjacent the source region 210, the drain region 208 is formed adjacent the merged drift region 212, and the back gate 216 is optionally formed adjacent the source 210. For example, in a NMOS FinFET, a P-type dopant is implanted in the body regions 202B, 204B and 206B, and an n-type dopant is implanted in the source region 210 and the drain region 208. In the example of the NMOS FinFET the back gate 216 is a p-type well (region).

In block 426, back end of line (BEOL) processing is performed. For example, metal terminals and/or routing traces are added to the source region 210, the drain region 208, and the gate electrode 218.

FIG. 8 shows temperature in the drain-source channel of a conventional FinFET versus the FinFET 200. Because of the improved heat transfer produced by the merged drift region 212, the peak operating temperature of the FinFET 200 is substantially (e.g., about 40° C.) lower than the peak operating temperature of the conventional FinFET under similar operating conditions.

Modifications are possible in the described embodiments, and other embodiments are possible, within the scope of the disclosure.

What is claimed is:
1. A fin field effect transistor (FinFET), comprising:
  a drain region having a first top surface and a first dopant concentration of a first conductivity type that extends above a surface of a semiconductor substrate;
  a merged drift region having a second top surface and a second lower dopant concentration of the first conduc- tivity type that extends above the substrate surface and touches the drain region, the first and second top surfaces being coplanar with a common plane;

a plurality of fins extending above the substrate surface and each directly connected to the merged drift region, each fin connected to a source region having the first conductivity type at a distal end of that fin from the merged drift region, and a field plate oxide layer formed over the merged drift region and extending above the common plane.

2. The FinFET of claim 1 wherein each fin includes:
a fin drift region having the first conductivity type and extending from the merged drift region;
a body region having a second opposite conductivity type and forming a junction with the fin drift region; and
a gate oxide layer formed over the body region.

3. The FinFET of claim 1, wherein the field plate oxide layer has a sidewall with a concave surface.

4. The FinFET of claim 2, further comprising a gate electrode formed over the gate oxide layer, wherein a portion of the merged drift region is not covered by the gate electrode.

5. The FinFET of claim 1, wherein the source region is connected to the plurality of fins.

6. The FinFET of claim 1, wherein the source region is connected to a back gate region that has a second opposite conductivity type, the back gate region touching the source region.

7. The FinFET of claim 1, wherein the plurality of fins share a third top surface coplanar with the common plane.

8. An integrated circuit comprising:
a semiconductor substrate;
a fin field effect transistor (FinFET) formed in or over the semiconductor substrate, the FinFET including:
 a merged drift region having a first conductivity type extending above the substrate;
 first and second fins extending upward from the substrate and from the merged drift region laterally over the substrate;
 a drain region extending upward from the substrate and from the merged drift region laterally over the substrate; and
 a field plate oxide layer extending above a plane coincident with a top surface of the first and second fins.

9. The integrated circuit of claim 8, wherein:
the first fin comprises:
 a first fin drift region having the first conductivity type;
 a first body region having a second opposite conductivity type adjacent the first fin drift region; and
 a first gate oxide layer over the first fin drift region; and
the second fin comprises:

a second fin drift region having the first conductivity type;
a second body region having the second opposite conductivity type adjacent the second fin drift region; and
a second gate oxide layer over the second fin drift region.

10. The integrated circuit of claim 8, wherein the field plate oxide layer has a sidewall with a concave surface.

11. The integrated circuit of claim 8, further comprising a source region connected to the first and second fins.

12. The integrated circuit of claim 8, further comprising a first source region located in the first fin and a second source region located in the second fin.

13. The integrated circuit of claim 8, further comprising a gate electrode located over a portion of the merged drift region less than a whole of the merged drift region.

14. An integrated circuit comprising:
a semiconductor substrate;
a plurality of semiconductor fins over a shallow trench isolation (STI) layer over the semiconductor substrate, each semiconductor fin including one of a corresponding plurality of fin drift regions having a first conductivity type and one of a corresponding plurality of source regions having the first conductivity type;
a merged drift region having the first conductivity type located over the semiconductor substrate, a first side of the merged drift region touching the semiconductor fins at the fin drift regions; and
a drain region having the first conductivity type located over the semiconductor substrate, an opposite second side of the merged drift region touching the drain region.

15. The integrated circuit of claim 14, wherein each of the semiconductor fins includes one of a corresponding plurality of body regions having an opposite second conductivity type located between the corresponding fin drift region and the corresponding source region.

16. The integrated circuit of claim 14, wherein the source regions are connected to a same backgate region having an opposite second conductivity type.

17. The integrated circuit of 15, further comprising a gate electrode that extends over the plurality of body regions and over the merged drift region.

18. The integrated circuit of claim 15, further comprising a dielectric layer that extends over the plurality of body regions, over the plurality of fin drift regions and over the merged drift region.

19. The integrated circuit of claim 18, wherein the dielectric layer covers a sidewall of the merged drift region.

20. The integrated circuit of claim 14, wherein the first conductivity type is n-type.

* * * * *